(12) United States Patent
De La Cropte De Chanterac et al.

(10) Patent No.: US 11,363,133 B1
(45) Date of Patent: Jun. 14, 2022

(54) BATTERY HEALTH-BASED POWER MANAGEMENT

(71) Applicant: Apple Inc., Cupertino, CA (US)

(72) Inventors: Cyril De La Cropte De Chanterac, San Francisco, CA (US); David M. Demuro, San Jose, CA (US); John Ananny, San Mateo, CA (US); Karen Eckert, San Jose, CA (US); Michael Eng, San Jose, CA (US); Nicholas W. Ruhter, San Francisco, CA (US); Stephen D. Sterz, San Jose, CA (US)

(73) Assignee: Apple Inc., Cupertino, CA (US)

( * ) Notice: Subject to any disclaimer, the term of this patent is extended or adjusted under 35 U.S.C. 154(b) by 40 days.

(21) Appl. No.: 15/849,533

(22) Filed: Dec. 20, 2017

(51) Int. Cl.
*H04M 1/73* (2006.01)
*G01R 31/36* (2020.01)
*H04W 52/02* (2009.01)
*G01R 31/392* (2019.01)

(52) U.S. Cl.
CPC .......... *H04M 1/73* (2013.01); *G01R 31/3648* (2013.01); *G01R 31/392* (2019.01); *H04W 52/0261* (2013.01)

(58) Field of Classification Search
CPC .. H04M 1/73; H04W 52/0261; G01R 31/392; G01R 31/3648
See application file for complete search history.

(56) References Cited

U.S. PATENT DOCUMENTS

| 5,483,261 A | 1/1996 | Yasutake |
| 5,488,204 A | 1/1996 | Mead et al. |
| 5,532,935 A * | 7/1996 | Ninomiya ............. H02J 7/0063 340/636.15 |
| 5,825,352 A | 10/1998 | Bisset et al. |
| 5,835,079 A | 11/1998 | Shieh |
| 5,880,411 A | 3/1999 | Gillespie et al. |
| 5,931,908 A | 8/1999 | Gerba et al. |
| 5,944,829 A | 8/1999 | Shimoda |
| 6,188,391 B1 | 2/2001 | Seely et al. |
| 6,310,610 B1 | 10/2001 | Beaton et al. |
| 6,323,846 B1 | 11/2001 | Westerman et al. |
| 6,498,460 B1 | 12/2002 | Atkinson |
| 6,690,387 B2 | 2/2004 | Zimmerman et al. |
| 6,809,724 B1 | 10/2004 | Shiraishi et al. |
| 7,015,894 B2 | 3/2006 | Morohoshi |

(Continued)

FOREIGN PATENT DOCUMENTS

| CN | 103199311 A | 7/2013 |
| CN | 103327159 A | 9/2013 |

(Continued)

OTHER PUBLICATIONS

Final Office Action dated Jul. 26, 2018, for U.S. Appl. No. 14/799,370, filed Jul. 14, 2015, six pages.

(Continued)

*Primary Examiner* — Bryan Bui
(74) *Attorney, Agent, or Firm* — Kubota & Basol LLP (57) ABSTRACT

A method of an electronic device that includes a power source is disclosed. The method determines a health of the power source, a temperature of the power source, and a state of charge of the power source. The method then sets a performance state cap for the electronic device based on at least the health of the power source.

30 Claims, 8 Drawing Sheets

(56) References Cited

U.S. PATENT DOCUMENTS

| | | |
|---|---|---|
| 7,016,705 B2 | 3/2006 | Bahl et al. |
| 7,184,064 B2 | 2/2007 | Zimmerman et al. |
| 7,494,067 B1 | 2/2009 | Zhu |
| 7,631,201 B2 | 12/2009 | Hansalia |
| 7,663,607 B2 | 2/2010 | Hotelling et al. |
| 8,121,656 B2 | 2/2012 | Imai |
| 8,214,429 B2 | 7/2012 | Chidel et al. |
| 8,271,057 B2 | 9/2012 | Levine et al. |
| 8,335,549 B2 | 12/2012 | Lee |
| 8,395,518 B2 | 3/2013 | Toba |
| 8,479,122 B2 | 7/2013 | Hotelling et al. |
| 8,526,782 B2 | 9/2013 | Kaiser et al. |
| 8,639,291 B1 | 1/2014 | Gailloux et al. |
| 8,686,682 B2 | 4/2014 | Eager et al. |
| 8,738,093 B1 | 5/2014 | Gopalakrishnan et al. |
| 8,774,868 B2 | 7/2014 | Niu et al. |
| 8,775,501 B2 | 7/2014 | Chidel et al. |
| 8,935,666 B2 | 1/2015 | Miller, III |
| 8,937,987 B2 | 1/2015 | Alberth et al. |
| 8,978,075 B1 | 3/2015 | Kaiser et al. |
| 9,031,382 B1 | 5/2015 | Kaiser et al. |
| 9,055,393 B2 | 6/2015 | Arora et al. |
| 9,075,612 B2 | 7/2015 | Yang et al. |
| 9,268,387 B2 | 2/2016 | Yu |
| 9,516,127 B2 | 12/2016 | Nirantar et al. |
| 9,620,001 B2 | 4/2017 | Brunolli |
| 9,647,489 B2 | 5/2017 | De La Cropte De Chanterac et al. |
| 9,678,571 B1 | 6/2017 | Robert et al. |
| 9,892,691 B1 * | 2/2018 | Lim .................. G09G 5/10 |
| 9,954,991 B2 | 4/2018 | Wang et al. |
| 10,228,751 B2 | 3/2019 | Andrews |
| 10,545,569 B2 | 1/2020 | Andrews et al. |
| 10,599,199 B1 | 3/2020 | De La Cropte De Chanterac et al. |
| 10,817,307 B1 | 10/2020 | De La Cropte De Chanterac et al. |
| 10,871,818 B1 * | 12/2020 | De La Cropte De Chanterac ...... G06F 1/325 |
| 2002/0042920 A1 | 4/2002 | Thomas et al. |
| 2002/0181333 A1 | 12/2002 | Ito et al. |
| 2003/0033449 A1 | 2/2003 | Frantz et al. |
| 2003/0050104 A1 | 3/2003 | Matsumura et al. |
| 2003/0051179 A1 | 3/2003 | Tsirkel et al. |
| 2003/0110171 A1 | 6/2003 | Ozer et al. |
| 2003/0149904 A1 | 8/2003 | Kim |
| 2003/0158609 A1 | 8/2003 | Chiu |
| 2004/0070371 A1 | 4/2004 | Chern et al. |
| 2004/0070511 A1 | 4/2004 | Kim |
| 2004/0177242 A1 | 9/2004 | Erickson |
| 2004/0267940 A1 | 12/2004 | Dideriksen et al. |
| 2005/0138137 A1 | 6/2005 | Encarnacion et al. |
| 2005/0273515 A1 | 12/2005 | Bodlaender |
| 2006/0005057 A1 | 1/2006 | Nalawadi et al. |
| 2006/0053321 A1 | 3/2006 | Mizusawa |
| 2006/0197753 A1 | 9/2006 | Hotelling |
| 2007/0022463 A1 | 1/2007 | Kelly |
| 2007/0192818 A1 | 8/2007 | Bourges-Sevenier et al. |
| 2007/0239920 A1 | 10/2007 | Frid |
| 2007/0239921 A1 | 10/2007 | Toorians et al. |
| 2007/0263860 A1 | 11/2007 | Buchen et al. |
| 2008/0015932 A1 | 1/2008 | Haeuser et al. |
| 2008/0022140 A1 | 1/2008 | Kamada et al. |
| 2008/0034392 A1 | 2/2008 | Mccarthy et al. |
| 2008/0079589 A1 | 4/2008 | Blackadar |
| 2008/0178019 A1 | 7/2008 | Mcgrane et al. |
| 2009/0055742 A1 | 2/2009 | Nordhagen |
| 2009/0058670 A1 | 3/2009 | Sweeney et al. |
| 2009/0086662 A1 | 4/2009 | Okada |
| 2009/0098914 A1 | 4/2009 | Martin-cocher et al. |
| 2009/0100274 A1 | 4/2009 | Diab et al. |
| 2009/0237252 A1 | 9/2009 | Inano et al. |
| 2009/0254914 A1 | 10/2009 | Sundaresan et al. |
| 2009/0259957 A1 | 10/2009 | Slocum et al. |
| 2009/0317061 A1 | 12/2009 | Jung et al. |
| 2010/0014825 A1 | 1/2010 | Curtis et al. |
| 2010/0030392 A1 | 2/2010 | Ferentz et al. |
| 2010/0042827 A1 | 2/2010 | Pratt et al. |
| 2010/0046752 A1 | 2/2010 | Fahrny et al. |
| 2010/0081485 A1 | 4/2010 | Velhal et al. |
| 2010/0162006 A1 | 6/2010 | Therien et al. |
| 2010/0185882 A1 | 7/2010 | Arnold et al. |
| 2010/0211804 A1 | 8/2010 | Brumley et al. |
| 2010/0259559 A1 | 10/2010 | Schneider |
| 2010/0293190 A1 | 11/2010 | Kaiser et al. |
| 2010/0313042 A1 | 12/2010 | Shuster |
| 2011/0059769 A1 | 3/2011 | Brunolli |
| 2011/0072435 A1 | 3/2011 | Yasutake |
| 2011/0154007 A1 | 6/2011 | Juvonen |
| 2011/0231519 A1 | 9/2011 | Luby et al. |
| 2011/0234617 A1 | 9/2011 | Watanabe |
| 2011/0246801 A1 | 10/2011 | Seethaler et al. |
| 2011/0252118 A1 | 10/2011 | Pantos et al. |
| 2011/0260691 A1 | 10/2011 | Ishibashi et al. |
| 2011/0264935 A1 | 10/2011 | Shetty et al. |
| 2011/0316769 A1 | 12/2011 | Boettcher et al. |
| 2012/0017004 A1 | 1/2012 | Furbeck |
| 2012/0047380 A1 | 2/2012 | Nurmi |
| 2012/0066673 A1 | 3/2012 | Miller, III |
| 2012/0072919 A1 | 3/2012 | Salsbery et al. |
| 2012/0096373 A1 | 4/2012 | Aguera y Arcas et al. |
| 2012/0185684 A1 | 7/2012 | Lee et al. |
| 2012/0239949 A1 | 9/2012 | Kalyanasundaram et al. |
| 2012/0254365 A1 | 10/2012 | Adimatyam et al. |
| 2012/0254454 A1 | 10/2012 | Margush et al. |
| 2012/0254631 A1 | 10/2012 | Skillman et al. |
| 2012/0254633 A1 | 10/2012 | Vilhauer et al. |
| 2012/0260118 A1 | 10/2012 | Jiang et al. |
| 2013/0014155 A1 | 1/2013 | Clarke et al. |
| 2013/0061249 A1 | 3/2013 | Schwartz et al. |
| 2013/0166655 A1 | 6/2013 | Martin |
| 2013/0244633 A1 | 9/2013 | Jacobs et al. |
| 2013/0254664 A1 | 9/2013 | Almstrand et al. |
| 2013/0303154 A1 | 11/2013 | Gupta et al. |
| 2013/0339772 A1 | 12/2013 | Yu |
| 2014/0007057 A1 | 1/2014 | Gill et al. |
| 2014/0015682 A1 | 1/2014 | Ratzlaff et al. |
| 2014/0020085 A1 | 1/2014 | Srour et al. |
| 2014/0068310 A1 | 3/2014 | Sultenfuss |
| 2014/0068314 A1 | 3/2014 | Kim et al. |
| 2014/0075220 A1 | 3/2014 | Song |
| 2014/0089948 A1 | 3/2014 | Li |
| 2014/0122738 A1 | 5/2014 | Thang et al. |
| 2014/0149753 A1 | 5/2014 | Park et al. |
| 2014/0181858 A1 | 6/2014 | Kitazato |
| 2014/0192692 A1 | 7/2014 | Stark et al. |
| 2014/0195653 A1 | 7/2014 | Alexander et al. |
| 2014/0195826 A1 * | 7/2014 | Wojcik .................. H05K 5/0086 713/300 |
| 2014/0239733 A1 | 8/2014 | Mach et al. |
| 2014/0245031 A1 | 8/2014 | Hamdi et al. |
| 2014/0245033 A1 | 8/2014 | Grokop et al. |
| 2014/0344804 A1 | 11/2014 | Ein-Gal et al. |
| 2014/0365790 A1 | 12/2014 | Chen et al. |
| 2014/0380282 A1 | 12/2014 | Ravindranath Sivalingam et al. |
| 2015/0000889 A1 | 1/2015 | Bellamkonda et al. |
| 2015/0007049 A1 | 1/2015 | Langlois |
| 2015/0040160 A1 | 2/2015 | Melnychenko et al. |
| 2015/0102992 A1 | 4/2015 | Klement et al. |
| 2015/0148109 A1 | 5/2015 | Gupta et al. |
| 2015/0156307 A1 | 6/2015 | Kim et al. |
| 2015/0185849 A1 | 7/2015 | Levesque et al. |
| 2015/0249355 A1 * | 9/2015 | Takano .................. B60L 58/12 320/150 |
| 2015/0264429 A1 | 9/2015 | Winograd et al. |
| 2015/0289019 A1 | 10/2015 | Merzon et al. |
| 2015/0372820 A1 | 12/2015 | Schneider et al. |
| 2016/0041597 A1 | 2/2016 | Graham et al. |
| 2016/0041606 A1 | 2/2016 | Andrews et al. |
| 2016/0062540 A1 | 3/2016 | Yang et al. |
| 2016/0064940 A1 | 3/2016 | De La Cropte De Chanterac et al. |
| 2016/0066278 A1 | 3/2016 | Zhao et al. |
| 2016/0127781 A1 | 5/2016 | Park |

(56) References Cited

U.S. PATENT DOCUMENTS

| | | | |
|---|---|---|---|
| 2016/0187432 | A1 | 6/2016 | Masakawa |
| 2016/0209906 | A1 | 7/2016 | Chae et al. |
| 2016/0241617 | A1 | 8/2016 | Jelley et al. |
| 2016/0299551 | A1 | 10/2016 | Wu et al. |
| 2017/0115355 | A1* | 4/2017 | Willard ............... G01R 31/392 |
| 2017/0346333 | A1 | 11/2017 | De La Cropte De Chanterac et al. |
| 2018/0131222 | A1* | 5/2018 | Nepote ..................... H02P 6/04 |
| 2018/0181185 | A1 | 6/2018 | Graham et al. |
| 2019/0115629 | A1* | 4/2019 | Chen ................. H01M 10/425 |
| 2019/0179404 | A1 | 6/2019 | Andrews et al. |
| 2019/0190277 | A1* | 6/2019 | Jung ....................... B60L 58/22 |
| 2019/0326776 | A1 | 10/2019 | De La Cropte De Chanterac et al. |
| 2020/0133384 | A1 | 4/2020 | Andrews et al. |

FOREIGN PATENT DOCUMENTS

| | | |
|---|---|---|
| CN | 103677520 A | 3/2014 |
| CN | 203520050 U | 4/2014 |
| CN | 103838992 A | 6/2014 |
| CN | 106605201 A | 4/2017 |
| EP | 2430833 A2 | 3/2012 |
| EP | 2 610 701 A1 | 7/2013 |
| EP | 2 610 701 A9 | 7/2013 |
| JP | 2000-163031 A | 6/2000 |
| JP | 2002-342033 A | 11/2002 |
| WO | 2010/132718 A2 | 11/2010 |

OTHER PUBLICATIONS

Notice of Allowance dated Oct. 25, 2018, for U.S. Appl. No. 14/799,370, filed Jul. 14, 2015, five pages.
Danish Search Report dated Apr. 20, 2017, for Application No. PA 2017 70089, eight pages.
Final Office Action dated Mar. 23, 2017, for U.S. Appl. No. 14/817,572, filed Aug. 4, 2015, 13 pages.
Final Office Action dated Apr. 27, 2017, for U.S. Appl. No. 14/799,370, filed Jul. 14, 2015, 19 pages.
International Search Report dated Jan. 29, 2016, for PCT Patent Application No. PCT/US2015/043487, eight pages.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Non-Final Office Action dated Aug. 12, 2016, for U.S. Appl. No. 14/799,370, filed Jul. 14, 2015, fourteen pages.
Non-Final Office Action dated Sep. 12, 2016, for U.S. Appl. No. 14/817,572, filed Aug. 4, 2015, eight pages.
Non-Final Office Action dated Dec. 1, 2017, for U.S. Appl. No. 14/799,370, filed Jul. 14, 2015, 23 pages.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI' 92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Notice of Allowance dated Nov. 30, 2017, for U.S. Appl. No. 14/817,572, filed Aug. 4, 2015, 26 pages.
Final Office Action received for U.S. Appl. No. 15/849,546, dated Jan. 16, 2020, 10 pages.
U.S. Appl. No. 61/924,200, filed Jan. 6, 2014, by Kaiser et al.
Non-Final Office Action received for U.S. Appl. No. 15/849,486, dated Apr. 23, 2019, 11 pages.
Non-Final Office Action received for U.S. Appl. No. 15/849,546, dated Jul. 10, 2019, 14 pages.
Non-Final Office Action received for U.S. Appl. No. 15/902,401, dated Jul. 19, 2019, 11 pages.
Notice of Allowance received for U.S. Appl. No. 15/849,486, dated Nov. 14, 2019, 15 pages.
Notice of Allowance received for U.S. Appl. No. 15/902,401, dated Dec. 4, 2019, 8 pages.
Notice of Allowance received for U.S. Appl. No. 16/275,031, dated Sep. 19, 2019, 7 pages.
Supplemental Notice of Allowance received for U.S. Appl. No. 15/902,401, dated Feb. 3, 2020, 2 pages.
Supplemental Notice of Allowance received for U.S. Appl. No. 15/902,401, dated Feb. 13, 2020, 2 pages.
Applicant Initiated Interview Summary received for U.S. Appl. No. 15/849,546, dated Jun. 15, 2020, 3 pages.
Final Office Action received for U.S. Appl. No. 14/812,904, dated Jun. 9, 2016, 12 pages.
Final Office Action received for U.S. Appl. No. 15/481,392, dated Jan. 3, 2019, 10 pages.
Non-Final Office Action received for U.S. Appl. No. 14/812,904, dated Jan. 26, 2016, 14 pages.
Non-Final Office Action received for U.S. Appl. No. 15/481,392, dated Jul. 3, 2018, 8 pages.
Notice of Allowance received for U.S. Appl. No. 14/812,904, dated Jan. 6, 2017, 5 pages.
Non-Final Office Action received for U.S. Appl. No. 16/730,743, dated Jul. 10, 2020, 16 pages.
Non-Final Office Action received for U.S. Appl. No. 16/503,349, dated Oct. 27, 2020, 7 pages.
Search Report received for Chinese Patent Application No. 201580047640.0, dated Oct. 16, 2020, 4 pages (2 pages of English Translation & 2 pages of Official Copy).
Notice of Allowance received for U.S. Appl. No. 15/849,546, dated Jun. 19, 2020, 11 pages.
Applicant-Initiated Interview Summary received for U.S. Appl. No. 15/849,546, dated Jun. 15, 2020, 2 pages.
Notice of Allowance received for U.S. Appl. No. 16/841,352, dated Oct. 27, 2020, 13 pages.
Corrected Notice of Allowance received for U.S. Appl. No. 16/730,743, dated Jan. 19, 2021, 2 pages.
Corrected Notice of Allowance received for U.S. Appl. No. 16/841,352, dated Dec. 2, 2020, 2 Pages.
Notice of Allowance received for U.S. Appl. No. 16/503,349, dated Apr. 12, 2021, 5 pages.
Notice of Allowance received for U.S. Appl. No. 16/730,743, dated Dec. 21, 2020, 5 pages.
Corrected Notice of Allowability received for U.S. Appl. No. 17/157,391, dated Dec. 30, 2021, 2 pages.
Non-Final Office Action received for U.S. Appl. No. 17/157,391, dated Aug. 23, 2021, 12 pages.
Notice of Allowance received for U.S. Appl. No. 17/157,391, dated Dec. 17, 2021, 8 pages.

* cited by examiner

BATTERY HEALTH-BASED POWER MANAGEMENT

FIELD OF THE DISCLOSURE

This relates generally to power management of an electronic device.

BACKGROUND OF THE DISCLOSURE

An electronic device may require a power supply, such as a battery. Further, the electronic device may require that the power supply have a certain minimum voltage in order to function properly. Accordingly, an electronic device may monitor the voltage and/or power output of its power supply, and power down the electronic device if the voltage/power output falls below an acceptable level (e.g., below a threshold voltage). This is known as a brownout, when power is still available to the device, but the voltage is too low to function properly. The ability of the power supply to provide sufficient voltage/power can be based on factors such as temperature and the health of the battery. Sometimes, the temperature and the health of the battery can be such that the power supply is unable to provide sufficient voltage/power to the electronic device.

SUMMARY OF THE DISCLOSURE

An electronic device may require a power supply, such as a battery. Further, the electronic device may require that the power supply have a certain minimum voltage in order to function properly. Accordingly, an electronic device may monitor the voltage and/or power output of its power supply, and power down the electronic device if the voltage/power output falls below an acceptable level (e.g., below a threshold voltage). This is known as a brownout, when power is still available to the device, but the voltage is too low to function properly. The ability of the power supply to provide sufficient voltage/power can be based on factors such as temperature and the health of the battery. Sometimes, the temperature and the health of the battery can be such that the power supply is unable to provide sufficient voltage/power to the electronic device. For example, if the health of the battery and/or the temperature of the battery are below acceptable levels, and multiple components of the device draw power all at once (e.g., speakers, camera flash, Wi-Fi, and Bluetooth), the power needs of the electronic device can be higher than what the battery can provide.

Examples of the disclosure are directed to methods of mitigating (e.g., throttling) a performance state cap (e.g., the maximum power draw of a power source in terms of mAh, current, or any other quantity that reflects the maximum power allowed to be drawn from a battery) of the electronic device to prevent the voltage/power output of its power supply from falling below an acceptable level (e.g., below a voltage threshold). In some examples, software operating on the electronic device or an associated electronic device (e.g., a paired electronic device) may monitor the health, the temperature, and/or the state of the remaining charge of the battery and reduce the maximum power draw accordingly, thereby preventing the device from drawing its maximum current capacity and causing the battery's voltage level to fall below an acceptable level. In some examples, software operating on the electronic device or an associated electronic device may cause the electronic device to enter a low power mode when the health, temperature, and/or state of the remaining charge fall below a respective threshold, thereby preventing the voltage/power output of its power supply from falling below an acceptable level (e.g., below a voltage threshold). Some examples of the disclosure are directed to displaying an indication of the state of charge of the battery, which can be indicative of remaining battery power. An electronic device may be any electronic device such as a desktop computer, portable multifunction device (e.g., a smartphone), wearable device, tablet computer, etc. In some examples, methods described herein may be useful for devices that have relatively low battery capacity. Further, the methods described herein may be particularly useful in cold temperature conditions and/or in other problematic operating conditions (e.g., operating an electronic device with a worn out and/or damaged battery).

DETAILED DESCRIPTION

In the following description of examples, references are made to the accompanying drawings that form a part hereof, and in which it is shown by way of illustration specific examples that can be practiced. It is to be understood that other examples can be used and structural changes can be made without departing from the scope of the disclosed examples.

An electronic device may require a power supply, such as a battery. Further, the electronic device may require that the power supply have a certain minimum voltage in order to function properly. Accordingly, an electronic device may monitor the voltage and/or power output of its power supply, and power down the electronic device if the voltage/power output falls below an acceptable level (e.g., below a threshold voltage). This is known as a brownout, when power is still available to the device, but the voltage is too low to function properly. The ability of the power supply to provide sufficient voltage/power can be based on factors such as temperature and the health of the battery. Sometimes, the temperature and the health of the battery can be such that the power supply is unable to provide sufficient voltage/power to the electronic device. For example, if the health of the battery and/or the temperature of the battery are below acceptable levels, and multiple components of the device draw power all at once (e.g., speakers, camera flash, Wi-Fi, and Bluetooth), the power needs of the electronic device can be higher than what the battery can provide.

Examples of the disclosure are directed to methods of mitigating (e.g., throttling) a performance state cap (e.g., the maximum power draw of a power source in terms of mAh, current, or any other quantity that reflects the maximum power allowed to be drawn from a battery) of the electronic device to prevent the voltage/power output of its power supply from falling below an acceptable level (e.g., below a voltage threshold). In some examples, software operating on the electronic device or an associated electronic device (e.g., a paired electronic device) may monitor the health, the temperature, and/or the state of the remaining charge of the battery and reduce the maximum power draw accordingly, thereby preventing the device from drawing its maximum current capacity and causing the battery's voltage level to fall below an acceptable level. In some examples, software operating on the electronic device or an associated electronic device may cause the electronic device to enter a low power mode when the health, temperature, and/or state of the remaining charge fall below a respective threshold, thereby preventing the voltage/power output of its power supply from falling below an acceptable level (e.g., below a voltage threshold). Some examples of the disclosure are directed to displaying an indication of the state of charge of the battery, which can be indicative of remaining battery power. An electronic device may be any electronic device such as a desktop computer, portable multifunction device (e.g., a smartphone), wearable device, tablet computer, etc. In some examples, methods described herein may be useful for devices that have relatively low battery capacity. Further, the methods described herein may be particularly useful in cold temperature conditions or in devices with an older (or worn out) battery where battery impedance may be particularly problematic.

Although examples disclosed herein may be described and illustrated herein primarily in terms of an electronic device having a battery, it should be understood that the examples are not so limited, but are additionally applicable to devices including any kind of power supply, such as an alternating current (AC) power supply.

Figure 1:
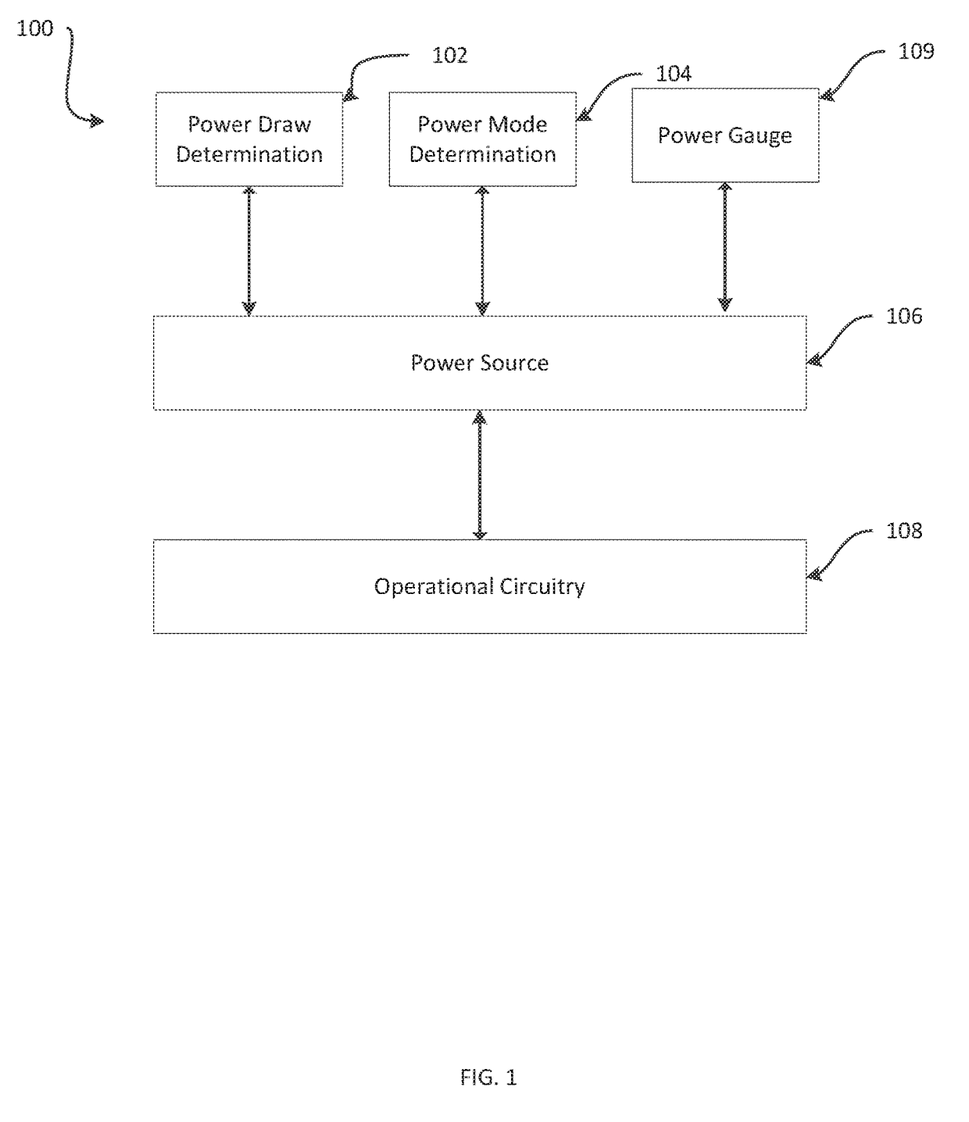
FIG. 1 illustrates an exemplary block diagram of a device according to examples of the disclosure.

FIG. 1 illustrates an exemplary block diagram of a device 100 according to examples of the disclosure. In some examples, device 100 can include power draw determination module 102, power mode determination module 104, power gauge 109, power source 106, and operational circuitry 108, each of which can be implemented as hardware, software, or firmware.

Power source 106 can be operationally coupled to power draw determination module 102, power mode determination module 104, power gauge 109, and operational circuitry 108, for example. In some examples, power source 106 can be a battery. In some examples, power source 106 can store the age of the power source. For example, power source 106 can store the manufacturing date of the battery. In another example, power source 106 can keep track of the number of charge-discharge cycles (e.g., the number of times the battery is charged above a certain amount and subsequently discharged below another amount). In another example, power source 106 can track the age of the battery in terms of hours (e.g., the total number of hours since the device was powered on for the very first time). In some examples, power source 106 can monitor the time the device operates above a threshold state of charge (e.g., 95% of charge). Operating a device at a high state of charge (e.g., 95% of the charge) can have detrimental effects on the battery. The power source 106 can also monitor the impedance of the battery. The impedance of the battery can cause a drop in the voltage/power output of the battery. As the battery gets older, the impedance of the battery can increase. Similarly, the impedance of the battery can increase as the battery is discharged. Smaller batteries (e.g., the batteries in portable devices) can get more constrained by impedance than larger batteries. In some examples, the impedance of a battery can be a good proxy for the health (e.g., wear and tear) of the battery.

Power draw determination module 102 can be operable to determine a performance state cap of the electronic device (e.g., the maximum power draw for the device and/or individual components) (e.g., as described below with reference to FIG. 2A). Power mode determination module 104 can be operable to determine whether to operate the device in a normal power mode or a low power mode (e.g., as described below with reference to FIG. 2B). Power gauge 109 can be operable to determine a state of charge of power source 106, for example. In some examples, state of charge can be indicative of an amount of power available for power source 106 to provide to the device 100 (e.g., a voltage level, a charge level, or some other measure that may relate to the remaining capacity of the battery). Operational circuitry 108 can correspond to the remaining components of the device (e.g., display, speaker(s), backlight, or processor(s)). Additionally or alternatively, in some examples, operational circuitry 108 can be operationally coupled to power draw determination module 102, power mode determination module 104, and/or power gauge 109.

Figure 2A:
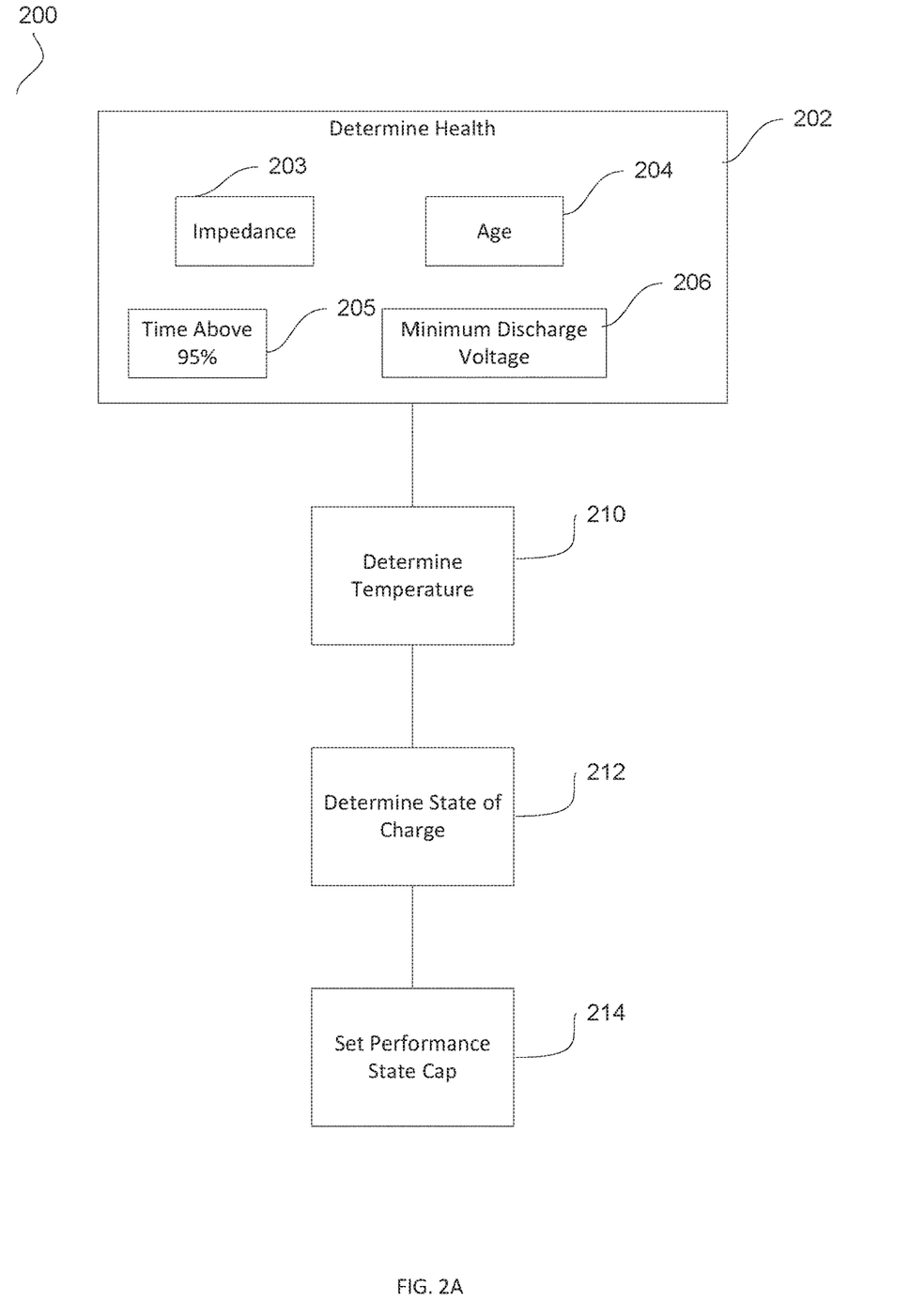
FIG. 2A illustrates an exemplary process for setting a performance state cap for an electronic device according to examples of the disclosure.

FIG. 2A illustrates an exemplary process 200 for setting a performance state cap for an electronic device according to examples of the disclosure. In some examples, a software controller can be configured to run process 200. In some examples, process 200 is implemented in power draw determination module 102 of FIG. 1. In some examples, process 200 can be run at device start-up, continuously, and/or periodically.

At step 202, process 200 determines the health of the battery (e.g., the state of the battery). In some examples, process 200 can determine the health of the battery by determining one or more characteristics about the battery. In some examples, process 200 can determine the impedance of the battery at step 203. In some examples, process 200 can determine the age of the battery at step 204. Process 200 can determine the age of the battery in numerous ways. For example, process 200 can look up the manufacturing date of the battery. In another example, process 200 can determine the age of the battery in terms of hours (e.g., the total number of hours since the device was powered on for the very first time). In another example, process 200 can determine the age of the battery by tracking the number of charge-discharge cycles (e.g., the number of times the battery is charged above a certain amount and subsequently discharged below another amount). In some examples, process 200 can determine the time the device operates above a threshold state of charge (e.g., 95% of charge) at step 205. This can represent the time the device has been used while connected to a power source. Operating a device at a high state of charge (e.g., 95% of the charge) can have detrimental effects on the battery. In some examples, the time determined at step 205 can be the total time (e.g., over the life of the device) that the device has ever been operated above the threshold. In other examples, the time determined at step 205 can be the duration of the last instance that the device was operated above the threshold. In some examples, process 200 can determine how many times the battery was discharged beyond a minimum discharge voltage (e.g., causing the device to shut down and/or enter a low power mode).

At step 210, process 200 can determine the temperature of the battery. In some examples, the temperature of the device can also be determined. In some examples, the average temperature of the battery (e.g., since manufacture of the battery) is determined.

At step 212, process 200 can determine the state of the charge of the battery (e.g., a voltage level, a charge level, or some other measure that may relate to the remaining capacity of the battery is determined).

At step 214, process 200 sets the performance state cap (e.g., the maximum power draw) of the device and/or individual components of the device. For example, process 200 may set the maximum current that the electronic device can draw from the battery, thereby preventing the device from drawing its maximum current capacity and causing the battery's voltage level to fall below a voltage threshold. For example, process 200 can reduce the performance state cap at step 214 if the health, temperature, and/or state of charge of the battery fall below a respective threshold. Likewise, process 200 can raise the performance state cap at step 214 if the health, temperature, and/or state of charge of the battery return above a respective threshold (e.g., process 200 can throttle/mitigate the maximum power draw value). For example, process 200 can lower the maximum power draw if the impedance of the battery is greater than 800 ohms. In another example, process 200 can lower the maximum power draw if the temperature of the battery falls below 8 degrees Celsius (e.g., a first threshold). Similarly, process 200 can further lower the maximum power draw if the temperature of the battery falls below −3 degrees Celsius (e.g., a second threshold, lower than the first threshold). Conversely, process 200 can raise the maximum power draw if the temperature rises above 12 degrees Celsius (e.g., above a third threshold, higher than the first threshold). In another example, process 200 can lower the maximum power draw if the impedance of the battery is above 425 ohms and the temperature of the battery is below 12 degrees Celsius.

For example, in some embodiments, if the impedance of the battery is low (e.g., less than 450 ohms) and the temperature of the battery is moderate (e.g., 16 to 25 degrees Celsius), the system may allow a processor to run at a maximum performance state if the state of charge of the battery is above a threshold (e.g., 40%). Whereas, in some embodiments, if the impedance of the battery high (e.g., above 700 ohms) and the temperature of the battery is moderate (e.g., 16 to 25 degrees Celsius), the system may only allow the process to run at a minimum performance state even if the charge is above the same threshold (e.g., 40%). Similarly, in some embodiments, if the impedance of the battery is moderate (e.g., between 450 and 700 ohms) and the temperate of the battery is moderate (e.g., 16 to 25 degrees Celsius), the system may only allow the processor to run at an intermediate performance state even if the state of charge of the battery is above the same threshold (e.g., 40%). In this way, the impedance of the battery is used as an input in managing the power for the system and/or one or more components of the system. It should be understood that multiple intermediate states can be used. In some embodiments, the impedance of the battery can be used as proxy for the health of the battery.

Figure 2B:
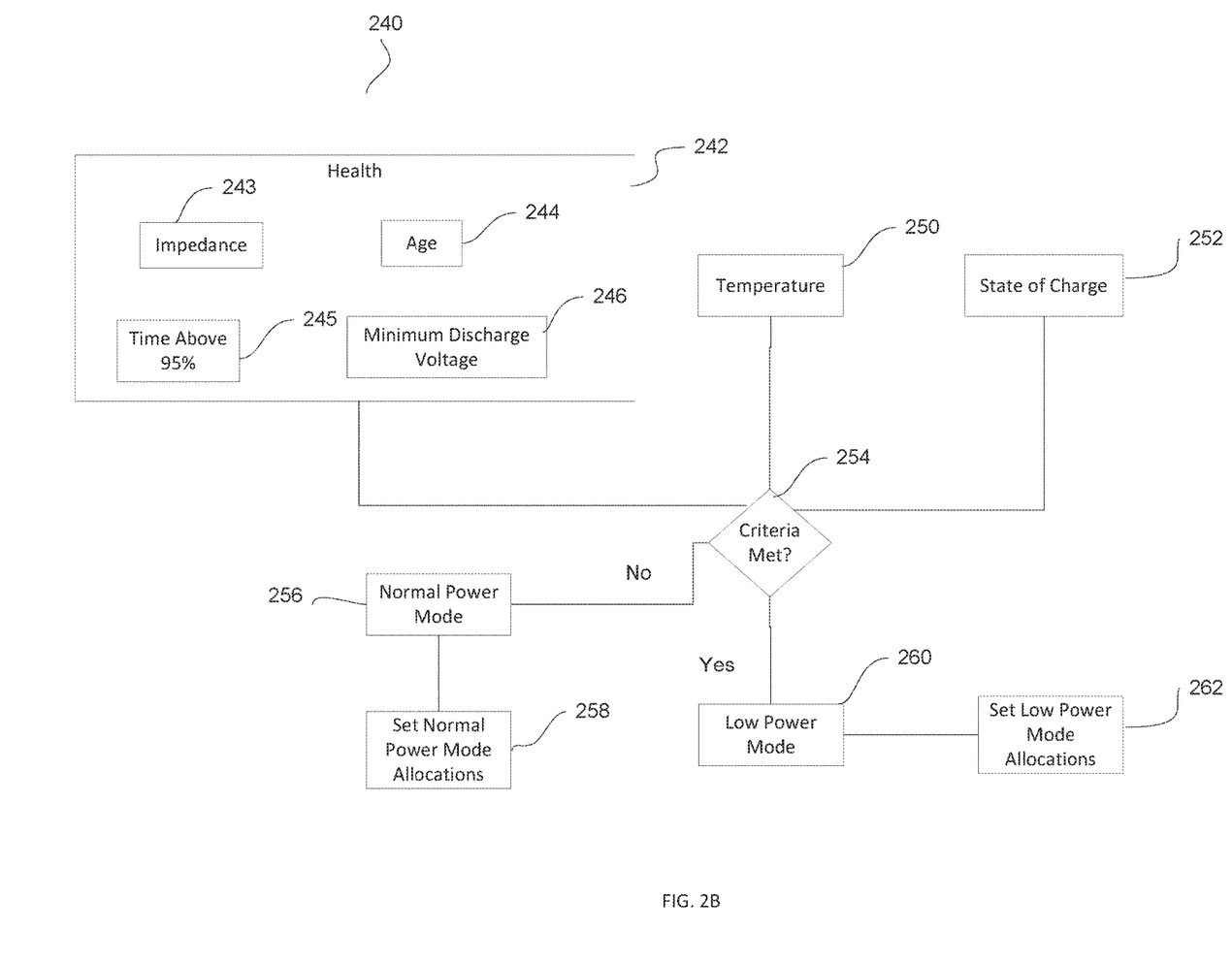
FIG. 2B illustrates an exemplary process for enabling different power modes according to examples of the disclosure

FIG. 2B illustrates exemplary process 240 for enabling different power modes on an electronic device according to examples of the disclosure. In some examples, a software controller can be configured to run process 240. In some examples, process 240 can be implemented in power mode determination module 104 of FIG. 1. In some examples, process 240 can be run at device start-up, continuously, and/or periodically.

At step 242, process 240 monitors the health of the battery (e.g., the state of the battery). In some examples, process 240 can monitor the health of the battery by monitoring one or more characteristics of the battery. In some examples, process 240 can monitor the impedance of the battery at step 243. In some examples, process 240 can monitor the age of the battery at step 244. Process 240 can monitor the age of the battery in numerous ways. For example, process 240 can look up the manufacturing date of the battery. In another example, process 240 can track the age of the battery in terms of hours (e.g., the total number of hours since the device was powered on for the very first time). In another example, process 240 can monitor the age of the battery by tracking the number of charge-discharge cycles (e.g., the number of times the battery is charged above a certain amount and subsequently discharged below another amount). In some examples, process 240 can monitor the time the device operates above a threshold state of charge (e.g., 95% of charge) at step 245. This can represent the time the device has been used while connected to a power source. Operating a device at a high state of charge (e.g., 95% of the charge) can have detrimental effects on the battery. In some examples, the time monitored at step 245 can be the total time (e.g., over the life of the device) the device has ever been operated above the threshold. In other examples, the time monitored at step 245 can be the duration of the last instance that the device was operated above the threshold. In some examples, process 240 can monitor how many times the battery is discharged beyond a minimum discharge voltage (e.g., causing the device to shut down and/or enter a low power mode).

At step 250, process 240 can monitor the temperature of the battery. In some examples, the temperature of the device can also be monitored. In some examples, the average temperature of the battery (e.g., since manufacture of the battery) is monitored.

At step 252, process 240 can monitor the state of the charge of the battery (e.g., a voltage level, a charge level, or some other measure that may relate to the remaining capacity of the battery).

At step 254, process 240 can determine whether criteria for the device to enter a low power mode are met. In some examples, the criteria can be met where the impedance of the battery is above a certain threshold, the age of the battery is above a certain threshold, the time above 95% is above a certain threshold, the number of times the battery is discharged beyond a minimum discharge voltage is above a certain threshold, the temperature of the battery (or device) is below (or above) a certain threshold, and/or the state of charge of the battery is below a certain threshold (e.g., below 20% of the charge capacitance). In accordance with a determination that the criteria for the device to enter a low power mode is not met, process 240 sets or maintains the device on a normal power mode 256. At step 258, process 240 can set normal power allocations to various device components based on being in the normal power mode (e.g., hardware peripherals such as a CPU, GPU, speaker, microphone, Wi-Fi controller, Bluetooth, NFC, accelerometer, gyroscope, magnetometer, GPS, PPG sensor, heart rate monitor, or EKG sensor). In some examples, these normal power allocations can conform to the performance states discussed above. In accordance with a determination that the criteria for the device to enter the low power mode are met, process 240 sets or maintains the device on a low power mode 260. At step 262, process 240 can set low power allocations to various device components based on being in the low power mode. For example, process 240 can set the maximum frequency of a CPU and/or GPU (e.g., dither clock to CPU and/or GPU), set the maximum brightness of backlight and/or flash, and/or set the maximum volume of a speaker. In addition or as an alternative, process 240 can also kill background processes at step 262. In addition or as an alternative, process 240 can disable the flash at step 262. In a low power mode, the device may also be enabled for a limited set of functions. The limited functionality and reduced usage of peripherals in the low power mode may prevent the battery from experiencing peaks in current level that may be problematic at relatively low levels of voltage. Operation in a lower power mode may also extend the useful operation of an electronic device. In some examples, these low power allocations can conform to the performance states discussed above.

Figure 3A:
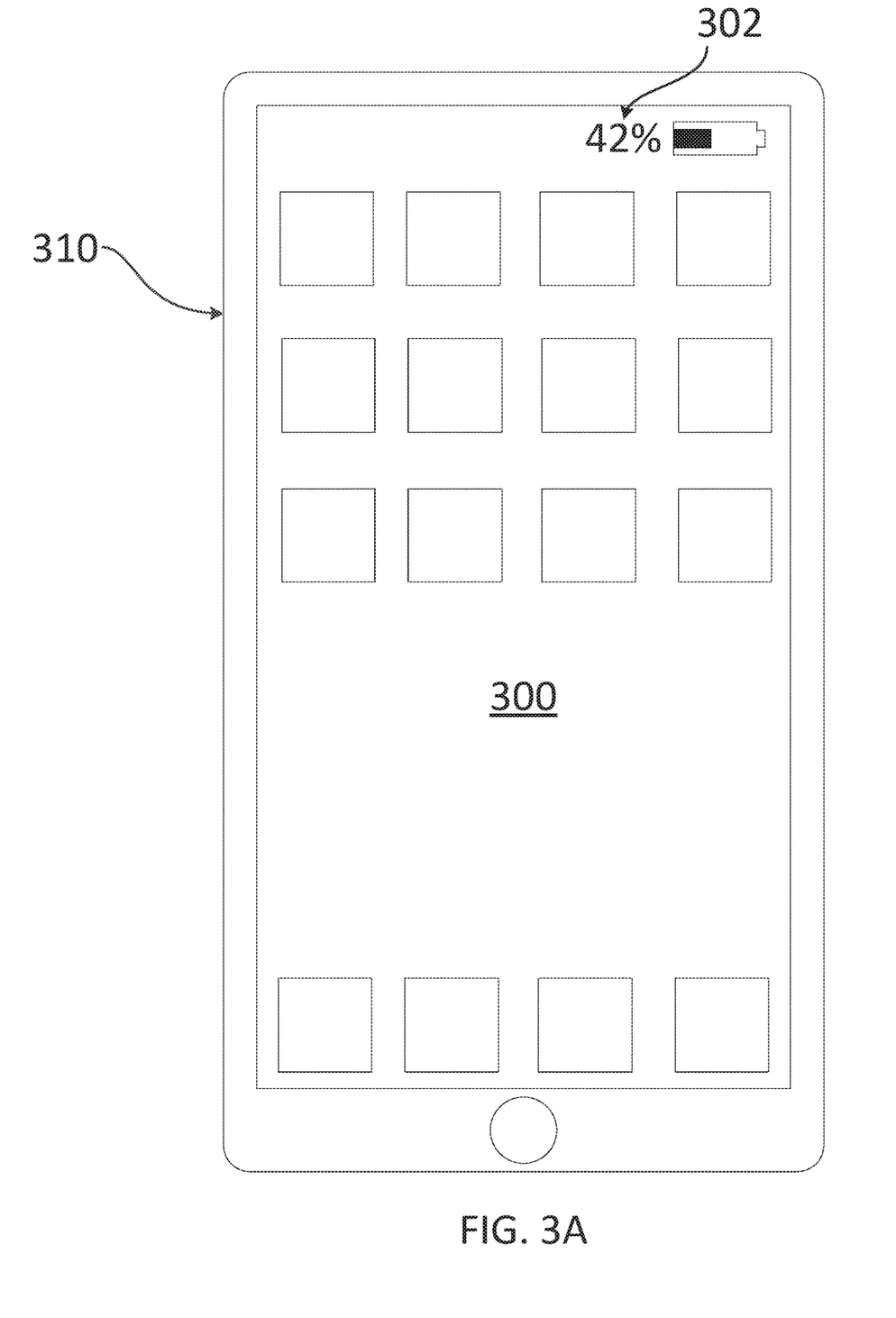
FIG. 3A illustrates an exemplary user interface for communicating battery state of charge at an electronic device according to examples of the disclosure.

FIG. 3A illustrates an exemplary user interface 300 for communicating battery state of charge at an electronic device 310 according to examples of the disclosure. The user interface 300 can include an indication 302 of the battery state of charge. In some examples, the battery state of charge can be indicated as a percentage of charge remaining in the battery. The displayed state of charge shown in the indication 302 can be calculated according to one or more examples described with reference to FIGS. 3B-3D.

Figure 3B:
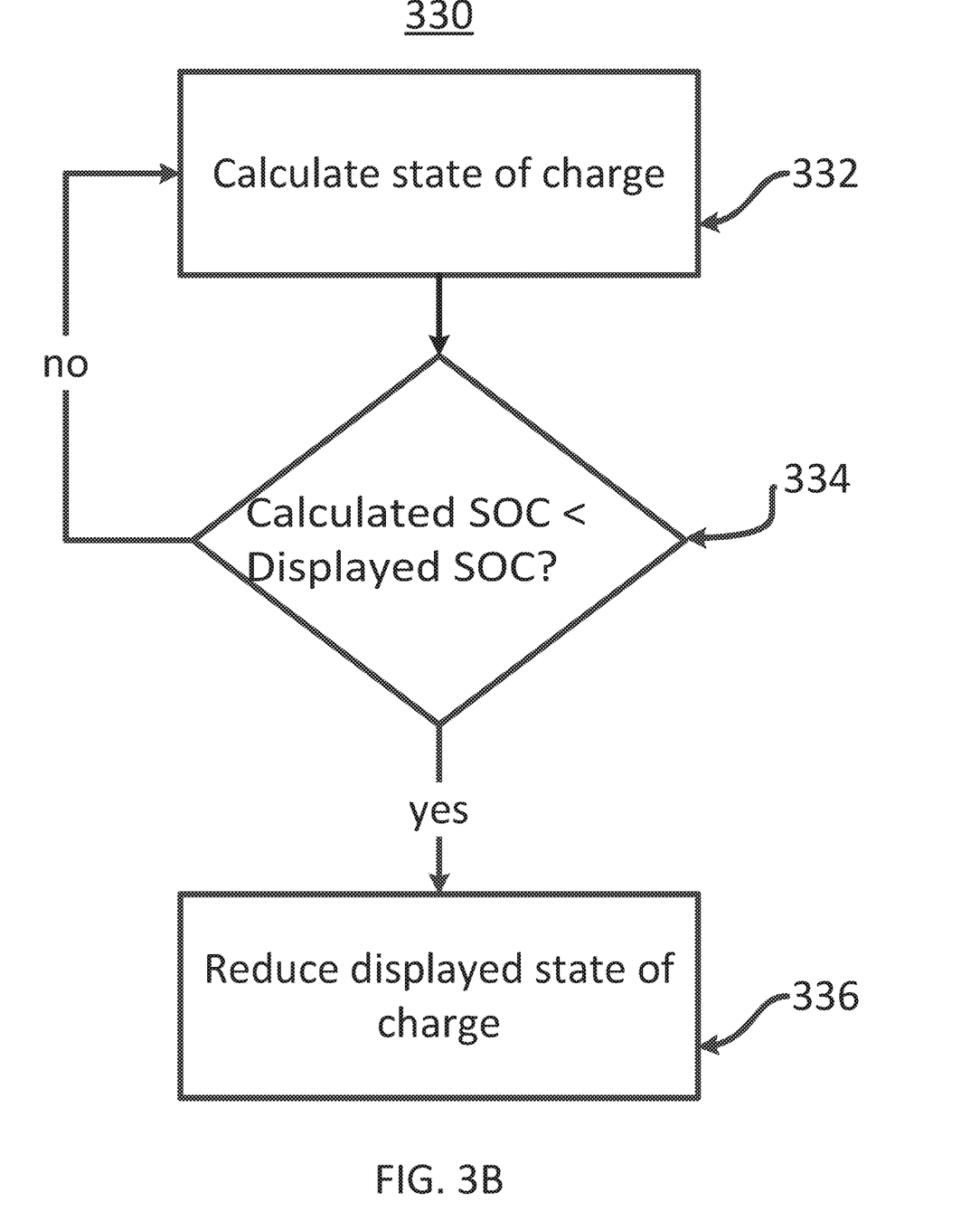
FIG. 3B illustrates an exemplary process for updating a user interface for communicating battery state of charge at an electronic device according to examples of the disclosure.

FIG. 3B illustrates an exemplary process 330 for updating a user interface for communicating battery state of charge at an electronic device according to examples of the disclosure. For example, process 330 can be used to update the displayed state of charge shown in the indication 302 of user interface 300 described with respect to FIG. 3A.

In some examples, indication 302 of user interface 300 represents a state of charge of a battery included in device 310. The battery's state of charge can be calculated in step 332 of process 330 by power gauge 109 based on a number of measured battery characteristics such as battery voltage, current draw, ambient temperature, battery impedance, time since last full charge, and/or number of full charge cycles in the battery's lifetime, for example. In some examples, state of charge can be based on additional or alternative characteristics. Generally speaking, as the battery discharges to power device 310, its state of charge will decrease. However, in some examples, calculated state of charge 332 can increase over time without the device 310 being plugged into a charger. For example, one or more parameters used to calculate the state of charge can change so that the battery operates more efficiently. An increase in ambient temperature, for example, can decrease the battery's internal impedance, thus allowing the battery to work more efficiently. In some examples, a reduced current draw due to a reduced complexity of applications and/or operations being executed by the device can increase battery efficiency. In these situations, the calculated state of charge may increase because there is effectively more battery power available to power device 310.

While power gauge 109 calculates the battery's state of charge at step 332, the device 310 can continue to display the indication 302 of the battery's state of charge. In step 334 of process 330, the device 310 can compare the value of the calculated state of charge from step 332 to the value of the state of charge displayed by user interface 300. If the calculated state of charge is greater than or equal to the displayed state of charge, process 330 can repeat step 332 and calculate the state of charge of the battery again. In some examples, step 332 can be repeated in regular intervals, thus allowing a pause between comparing the calculated state of charge to the displayed state of charge and re-calculating the state of charge. If the calculated state of charge is less than the displayed state of charge, the displayed state of charge can be reduced (e.g., by a predetermined amount, such as 1%) in step 336 of process 330.

Reducing the displayed state of charge by a predetermined amount when the calculated state of charge is less than the displayed state of charge can be preferable to simply displaying the calculated state of charge. For instance, as discussed above, cases where the calculated state of charge can increase without the device 310 being plugged into a charger may occur. Many users may think of the displayed state of charge as an indication of how much "fuel" is left in the battery, much like the fuel of a vehicle, and would be confused if the indicated state of charge increased without the device 310 being plugged in. Accordingly, by decreasing the displayed state of charge when the calculated state of charge is less than the displayed state of charge and providing a delay to calculate the state of charge in regular intervals, the displayed state of charge can decrease smoothly, and may never increase. As a result, the user interface 300 can intuitively make sense to the user of device 310.

Figure 3C:
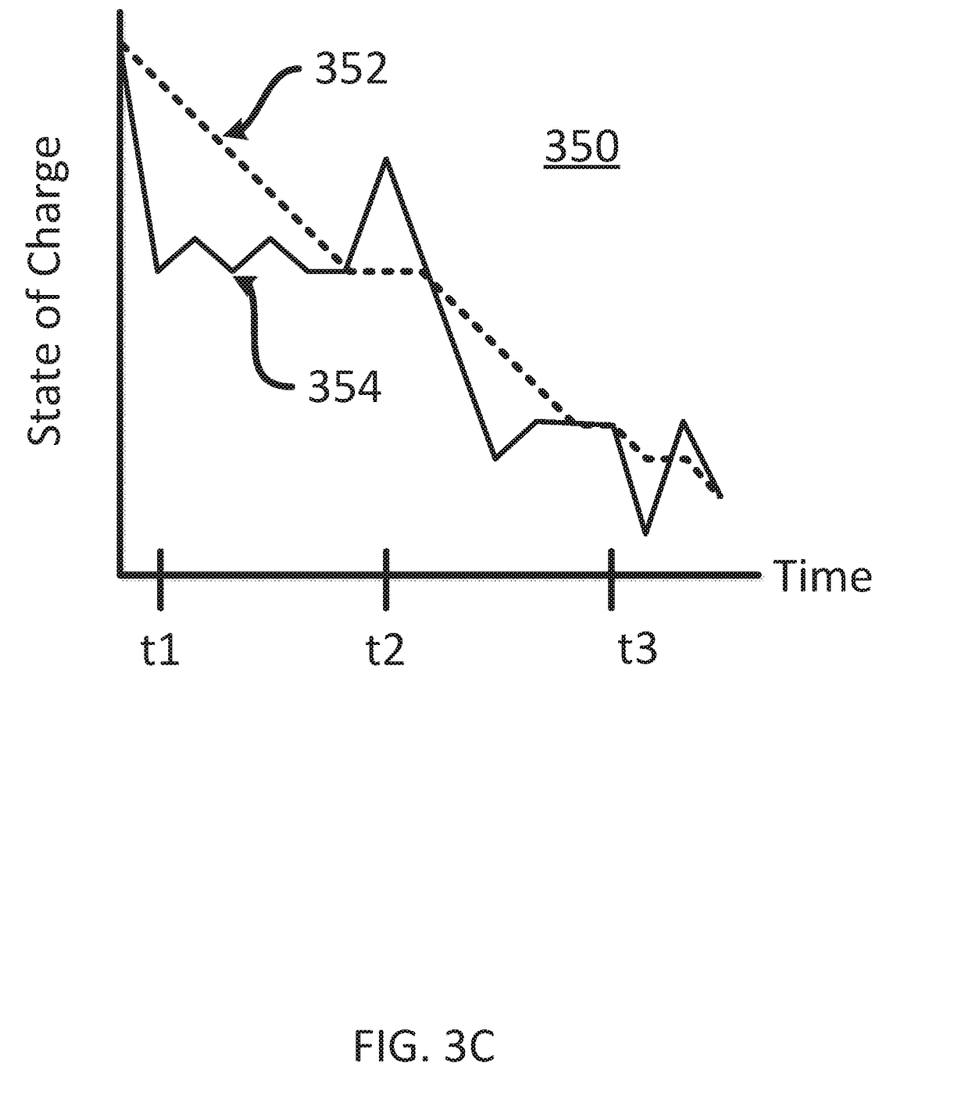
FIG. 3C illustrates an exemplary timeline including the values of the calculated state of charge and the displayed state of charge of a battery according to examples of the disclosure.
Figure 3D:
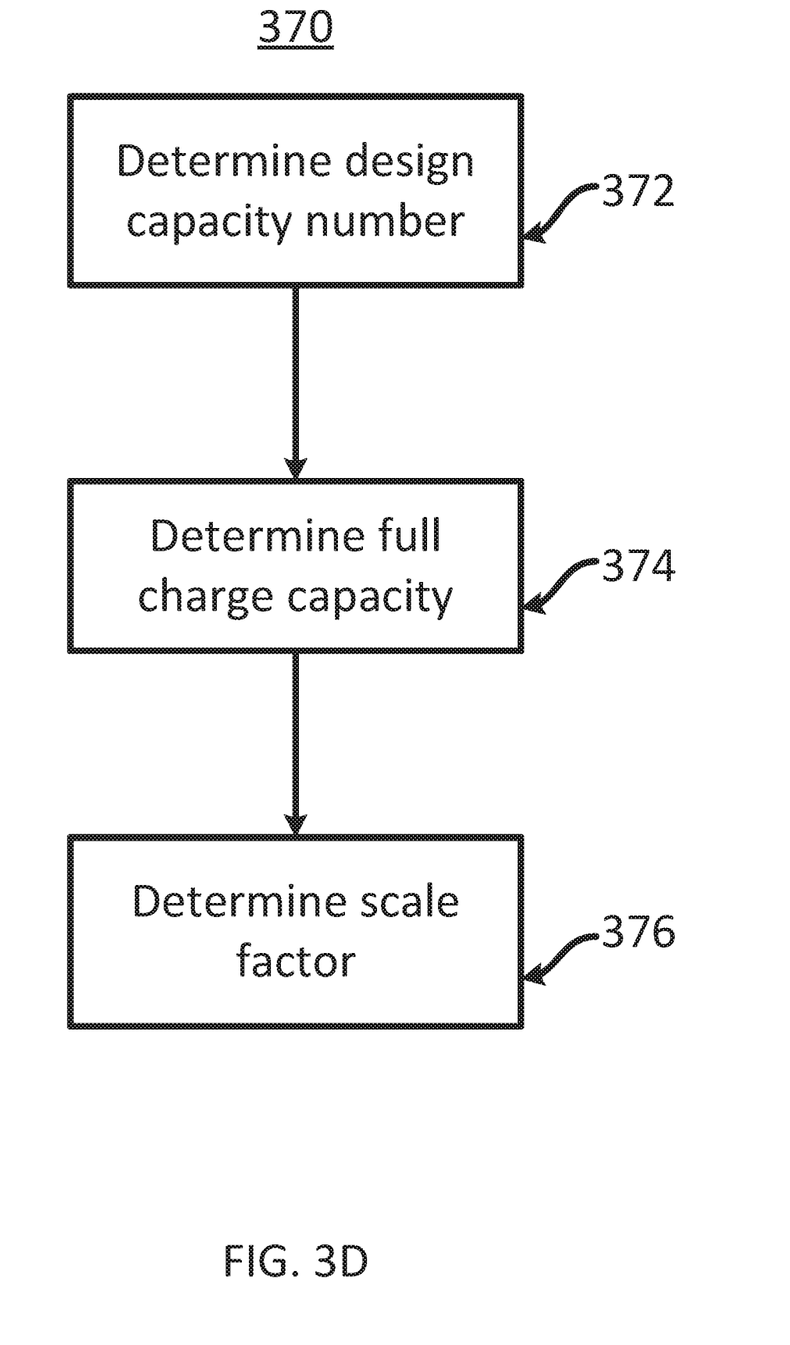
FIG. 3D illustrates an exemplary process for determining a scale factor for a battery percentage deduction of a user interface for communicating battery state of charge at an electronic device according to examples of the disclosure.

FIG. 3C illustrates an exemplary timeline 350 including the values of the calculated state of charge 354 and the displayed state of charge 352 of a battery according to examples of the disclosure. Displayed state of charge 352 can be updated according to any of the processes disclosed herein, including process 330 discussed above and process 370 discussed below. At time t1 of timeline 350, the calculated state of charge 354 can decrease such that the calculated state of charge is less than the displayed state of charge 352, for example. Accordingly, the displayed state of charge is decreased by a predetermined amount. In some examples, while the calculated state of charge 354 remains lower than the displayed state of charge 352, the displayed state of charge continues to decrease by the predetermined amount. At time t2, however, the calculated state of charge 354 can increase, as discussed above. In response, the displayed state of charge 352 can remain constant at t2. The displayed state of charge 352 can also remain constant at time t3 when the calculated state of charge 354 remains constant from one sample to the next.

Referring again to FIG. 3B, in some examples, step 336 of process 330 can include decreasing the displayed state of charge by a predetermined amount, such as by 1%. After decreasing the displayed state of charge in step 336, process 330 can begin again at step 332. In some examples, step 332 begins after a delay, allowing the state of charge to be calculated in regular intervals. Decreasing the displayed state of charge by 1% at step 336 can allow the displayed state of charge to track the calculated state of charge in many situations. However, in some situations, decreasing the displayed state of charge by 1% at step 336 may not reflect the calculated state of charge. For example, a battery that is consuming energy at a high rate may completely discharge before the displayed state of charge has time to reflect the low calculated state of charge. A number of factors can cause the battery to discharge faster, including temperature, current draw, battery voltage, and battery age, for example. Other factors are possible. In some examples, additionally or alternatively to battery discharge, a battery's age/impedance/temperature can limit the amount of usable power that the battery can deliver, which can reduce the effective state of charge of the battery, which can be reflected in the indicated state of charge, as will be described below. Accordingly, it can be advantageous, in some examples, to calculate a scale factor to be applied to the predetermined amount by which the displayed state of health is decreased in step 336 of process 330.

FIG. 3D illustrates an exemplary process 370 for determining a scale factor for a battery state of charge deduction of a user interface for communicating battery state of charge at an electronic device according to examples of the disclosure. Process 370 can be applied to any of the examples illustrated with reference to FIGS. 1-3C discussed above.

At step 372 of process 370, a design capacity number of the battery can be determined, for example. In some examples, the design capacity number can be the amount of charge that the battery can hold at full power, or can otherwise reflect the power delivery ability of the battery, when new (e.g., "as designed"). In some cases, the design capacity number can be known by the electronic device having the battery, and can be loaded from memory, for example. Additionally or alternatively, the design capacity number can be calculated based on a number of battery characteristics when the battery is fully charged, such as battery voltage, battery impedance, and/or information provided by the battery manufacturer, for example.

At step 374 of process 370, in some examples, the battery's current full charge capacity can be determined. The full charge capacity of the battery can be effected by the state of health of the battery, and can quantify how efficiently the battery is currently operating based on a number of factors such as temperature, current draw, battery voltage, battery impedance, and battery age, for example. Additional or alternative factors are possible. In some examples, not all of the aforementioned factors are used to determine the full charge capacity. The full charge capacity can be expressed in units of power such that the value of the full charge capacity can be equal to the available capacity if the battery were fully charged and operating at its current efficiency, for example. That is to say, the available capacity can be equal to the battery's total capacity minus the power that is wasted due to inefficient battery use. In some examples, other ways of expressing full charge capacity are possible.

In some examples, at step 376 of process 370, the scale factor can be determined based on the design capacity number and the full charge capacity. The scale factor can be calculated using the value of the design capacity number, the value of the full charge capacity, and other quantities, for example. In some examples, the scale factor can be a ratio of the design capacity number to the full charge capacity (e.g., when the battery is new and efficient, the scale factor can be ~1, and as the battery gets older and less efficient with respect to being new, the scale factor can increase from 1). Other mathematical formulas using design capacity number and full charge capacity are possible. In some examples, the scale factor can be constrained by one or more boundaries, such as a maximum value and a minimum value. Without applying a scale factor, the displayed state of health can be decreased by a fixed predetermined value, such as 1%, each time step 336 of process 330 is executed. Including a scale factor allows the displayed state of health to decrease by a different amount, such as 1.5% or 2.5% when step 336 of process 330 is executed, for example.

In some examples, an electronic device can perform process 370 for determining a scale factor in conjunction with process 330 for updating a displayed battery state of health. The steps of process 370 can be performed concurrently with the steps of process 330, or the two processes can be performed in an interleaved manner. In some examples, process 370 can be performed each time the displayed battery percentage is decreased in step 336 of process 330. Alternatively, process 370 can be performed once per a predetermined number of times that process 330 is performed or once per a predetermined number of times that step 336 of process 330 is performed. Alternatively, process 370 can be performed in regular time intervals independent from the performance of process 330.

Figure 4:
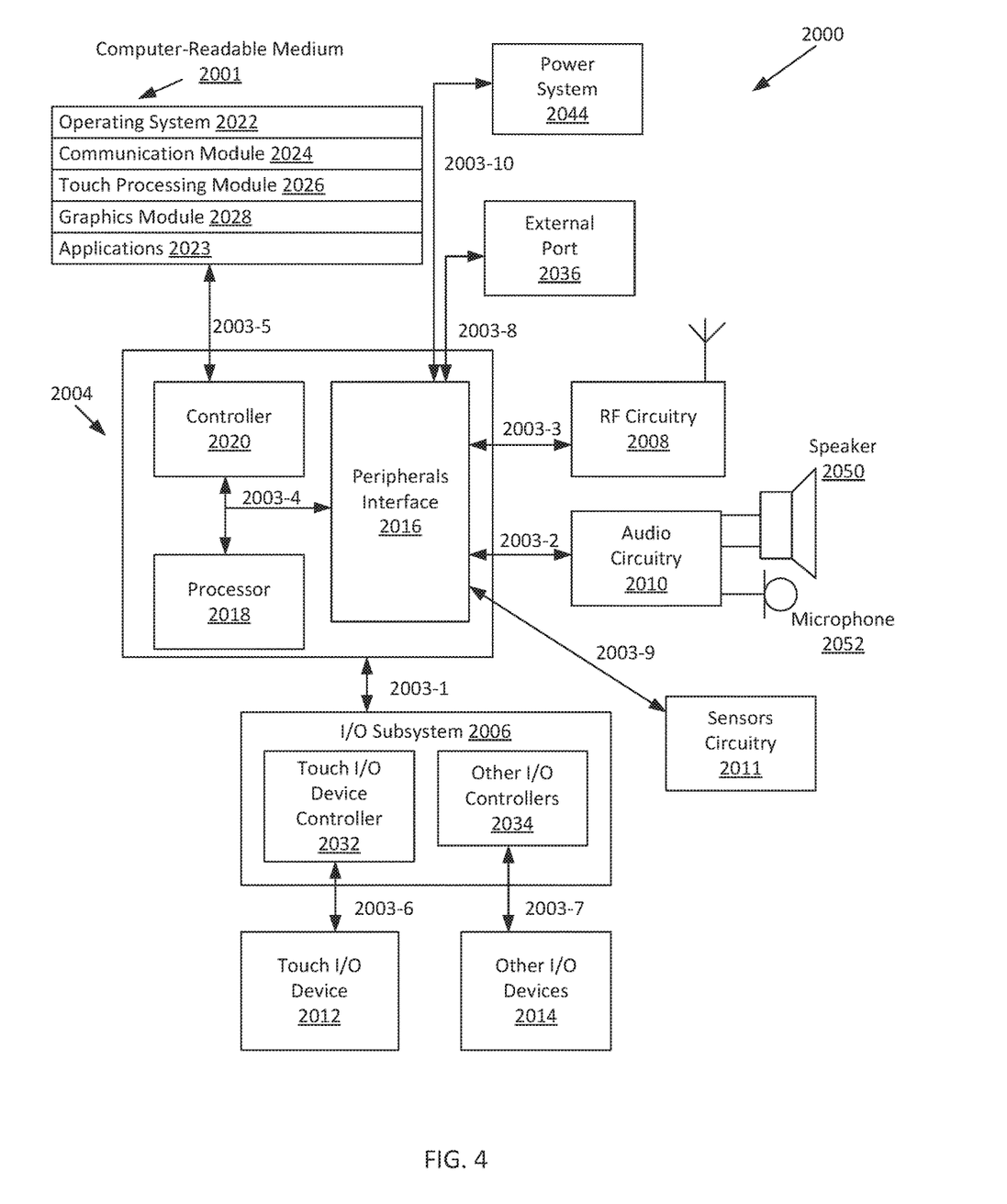
FIG. 4 is a block diagram illustrating an example of a system architecture that may be embodied within any portable or non-portable device according to examples of the disclosure.

Attention is now directed towards examples of a system architecture that may be embodied within any portable or non-portable electronic device according to the examples of the disclosure, including, but not limited to, a communication device (e.g., a mobile phone or smart phone), a multimedia device (e.g., an MP3 player, TV, or radio), a portable or handheld computer (e.g., a tablet, netbook, or laptop), a desktop computer, an All-In-One desktop, a peripheral device, a wearable device (e.g., a smart watch) or any other system or device adaptable to the inclusion of system architecture 2000, including combinations of two or more of these types of devices. FIG. 3 is a block diagram of one example of system 2000 that generally includes one or more computer-readable mediums 2001, processing system 2004, I/O subsystem 2006, radio frequency (RF) circuitry 2008, audio circuitry 2010, sensors circuitry 2011, and power system 2044. These components may be coupled by one or more communication buses or signal lines 2003.

It should be apparent that the architecture shown in FIG. 4 is only one example architecture of system 2000, and that system 2000 could have more or fewer components than shown, or a different configuration of components. The various components shown in FIG. 4 can be implemented in hardware, software, firmware or any combination thereof, including one or more signal processing and/or application specific integrated circuits. System 2000 can correspond to the electronic device in which the power management functions of the disclosure are implemented.

RF circuitry 2008 can be used to send and receive information over a wireless link or network to one or more other devices and includes well-known circuitry for performing this function. RF circuitry 2008 and audio circuitry 2010 can be coupled to processing system 2004 via peripherals interface 2016. Interface 2016 can include various known components for establishing and maintaining communication between peripherals and processing system 2004. Audio circuitry 2010 can be coupled to audio speaker 2050 and microphone 2052 and can include known circuitry for processing voice signals received from interface 2016 to enable a user to communicate in real-time with other users. In some examples, audio circuitry 2010 can include a headphone jack (not shown). Sensors circuitry 2011 can be coupled to various sensors, including, but not limited to, one or more light emitting diodes (LEDs) or other light emitters, one or more photodiodes or other light sensors, one or more photothermal sensors, a magnetometer, an accelerometer, a gyroscope, a barometer, a compass, a proximity sensor, a camera, an ambient light sensor, a thermometer, a GPS sensor, and various system sensors which can sense remaining battery life, power consumption, processor speed, CPU load, and the like. In some examples, one or more sensors of the sensors circuitry 2011 can be incorporated into the power draw determination module 102, power mode determination module 104, and/or power gauge 109.

Peripherals interface 2016 can couple the input and output peripherals of the system to processor 2018 and computer-readable medium 2001. One or more processors 2018 communicate with one or more computer-readable mediums 2001 via controller 2020. Computer-readable medium 2001 can be any device or medium that can store code and/or data for use by one or more processors 2018. In some examples, medium 2001 can be a non-transitory computer-readable storage medium. Medium 2001 can include a memory hierarchy, including, but not limited to, cache, main memory, and secondary memory. The memory hierarchy can be implemented using any combination of RAM (e.g., SRAM, DRAM, or DDRAM), ROM, FLASH, magnetic and/or optical storage devices, such as disk drives, magnetic tape, CDs (compact discs) and DVDs (digital video discs). Medium 2001 may also include a transmission medium for carrying information-bearing signals indicative of computer instructions or data (with or without a carrier wave upon which the signals are modulated). For example, the transmission medium may include a communications network, including, but not limited to, the Internet (also referred to as the World Wide Web), intranet(s), Local Area Networks (LANs), Wide Local Area Networks (WLANs), Storage Area Networks (SANs), Metropolitan Area Networks (MANs) and the like.

One or more processors 2018 can run various software components stored in medium 2001 to perform various functions for system 2000. In some examples, the software components can include operating system 2022, communication module (or set of instructions) 2024, touch processing module (or set of instructions) 2026, graphics module (or set of instructions) 2028, and one or more applications (or set of instructions) 2030. Each of these modules and above-noted applications can correspond to a set of instructions for performing one or more of the power management functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise rearranged in various examples. In some examples, medium 2001 may store a subset of the modules and data structures identified above, such as power draw determination module 102, power mode determination module 104, and power gauge 109. Furthermore, medium 2001 may store additional modules and data structures not described above.

Operating system 2022 can include various procedures, sets of instructions, software components and/or drivers for controlling and managing general system tasks (e.g., memory management, storage device control, or power management) and facilitates communication between various hardware and software components.

Communication module 2024 can facilitate communication with other devices over one or more external ports 2036 or via RF circuitry 2008 and can include various software components for handling data received from RF circuitry 2008 and/or external port 2036.

Graphics module 2028 can include various known software components for rendering, animating, and displaying graphical objects on a display surface. In examples in which touch I/O device 2012 is a touch sensing display (e.g., touch screen), graphics module 2028 can include components for rendering, displaying, and animating objects on the touch sensing display.

One or more applications 2030 can include any applications installed on system 2000, including, without limitation, a browser, address book, contact list, email, instant messaging, word processing, keyboard emulation, widgets, JAVA-enabled applications, encryption, digital rights management, voice recognition, voice replication, location determination capability (such as that provided by the global positioning system (GPS), a music player).

Touch processing module 2026 can include various software components for performing various tasks associated with touch I/O device 2012, including, but not limited to, receiving and processing touch input received from I/O device 2012 via touch I/O device controller 2032.

I/O subsystem 2006 can be coupled to touch I/O device 2012 and one or more other I/O devices 2014 for controlling or performing various functions. Touch I/O device 2012 can communicate with processing system 2004 via touch I/O device controller 2032, which can include various components for processing user touch input (e.g., scanning hardware). One or more other input controllers 2034 can receive/send electrical signals from/to other I/O devices 2014. Other I/O devices 2014 may include physical buttons, dials, slider switches, sticks, keyboards, touch pads, additional display screens, or any combination thereof.

If embodied as a touch screen, touch I/O device 2012 can display visual output to the user in a graphical user interface (GUI). The visual output may include text, graphics, video, and any combination thereof. Some or all of the visual output may correspond to user-interface objects, such as objects included in user interface 300. Touch I/O device 2012 can form a touch sensing surface that accepts touch input from the user. Touch I/O device 2012 and touch screen controller 2032 (along with any associated modules and/or sets of instructions in medium 2001) can detect and track touches or near touches (and any movement or release of the touch) on touch I/O device 2012 and can convert the detected touch input into interaction with graphical objects, such as one or more user-interface objects. In the case in which device 2012 is embodied as a touch screen, the user can directly interact with graphical objects that are displayed on the touch screen. Alternatively, in the case in which device 2012 is embodied as a touch device other than a touch screen (e.g., a touch pad), the user may indirectly interact with graphical objects that are displayed on a separate display screen embodied as I/O device 2014.

Touch I/O device 2012 may be analogous to the multi-touch sensing surface described in the following U.S. Pat. No. 6,323,846 (Westerman et al.), U.S. Pat. No. 6,570,557 (Westerman et al.), and/or U.S. Pat. No. 6,677,932 (Westerman), and/or U.S. Patent Publication 2002/0015024A1, each of which is hereby incorporated by reference.

In examples in which touch I/O device 2012 is a touch screen, the touch screen may use liquid crystal display (LCD) technology, light emitting polymer display (LPD) technology, organic light emitting diode (OLED), or organic electro luminescence (OEL), although other display technologies may be used in other examples.

Feedback may be provided by touch I/O device 2012 based on the user's touch input as well as a state or states of what is being displayed and/or of the computing system. Feedback may be transmitted optically (e.g., by light signal or displayed image), mechanically (e.g., by haptic feedback, touch feedback, force feedback, or the like), electrically (e.g., by electrical stimulation), olfactory, acoustically (e.g., by beep or the like), or by similar means or any combination thereof and in a variable or non-variable manner.

System 2000 can also include power system 2044 for powering the various hardware components of system 2000 and may include a power management system, one or more power sources (e.g., a battery), a recharging system, a power failure detection circuit, a power converter or inverter, a power status indicator, and any other components typically associated with the generation, management, and distribution of power in portable devices. In some examples, the logic and/or circuitry for performing the power management functions of the disclosure can be included in power system 2044, which can be communicatively coupled via link 2003-10 to the remainder of system 2000.

In some examples, peripherals interface 2016, one or more processors 2018, and memory controller 2020 may be implemented on a single chip, such as processing system 2004. In some other examples, they may be implemented on separate chips.

Thus, the examples of the disclosure provide various ways to manage the power of an electronic device.

Therefore, according to the above, some examples of the disclosure are directed to a method of an electronic device including a power source, the method comprising: determining a health of the power source; determining a temperature of the power source; determining a state of charge of the power source; and setting a performance state cap for the electronic device based on at least the health of the power source. Additionally or alternatively to one or more of the examples disclosed above, in some examples, the performance state cap is a maximum power draw, from the power source, for the electronic device. Additionally or alternatively to one or more of the examples disclosed above, in some examples, setting the performance state cap comprises reducing the performance state cap if the temperature is below a first threshold. Additionally or alternatively to one or more of the examples disclosed above, in some examples, setting the performance state cap comprises maintaining the performance state cap if the temperature is above the first threshold. Additionally or alternatively to one or more of the examples disclosed above, in some examples, setting the performance state cap comprises increasing the performance state cap if the temperature is above a second threshold, different than the first threshold. Additionally or alternatively to one or more of the examples disclosed above, in some examples, setting the performance state cap comprises reducing the performance state cap if the state of charge is below a first threshold. Additionally or alternatively to one or more of the examples disclosed above, in some examples, setting the performance state cap comprises reducing the performance state cap if the state of charge is below a first threshold and the temperature is below a second threshold. Additionally or alternatively to one or more of the examples disclosed above, in some examples, determining the health of the power source comprises determining an impedance of the power source. Additionally or alternatively to one or more of the examples disclosed above, in some examples, setting the performance state cap comprises reducing the performance state cap if the impedance of the power source is above a first threshold.

Some examples of the disclosure are directed to a non-transitory computer readable storage medium storing one or more programs, the one or more programs comprising instructions, which when executed by an electronic device including a power source, cause the electronic device to perform a method comprising: determining a health of the power source; determining a temperature of the power source; determining a state of charge of the power source; and setting a performance state cap for the electronic device based on at least the health of the power source. Additionally or alternatively to one or more of the examples disclosed above, in some examples, the performance state cap is a maximum power draw, from the power source, for the electronic device. Additionally or alternatively to one or more of the examples disclosed above, in some examples, setting the performance state cap comprises reducing the performance state cap if the temperature is below a first threshold. Additionally or alternatively to one or more of the examples disclosed above, in some examples, setting the performance state cap comprises maintaining the performance state cap if the temperature is above the first threshold. Additionally or alternatively to one or more of the examples disclosed above, in some examples, setting the performance state cap comprises increasing the performance state cap if the temperature is above a second threshold, different than the first threshold. Additionally or alternatively to one or more of the examples disclosed above, in some examples, setting the performance state cap comprises reducing the performance state cap if the state of charge is below a first threshold. Additionally or alternatively to one or more of the examples disclosed above, in some examples, setting the performance state cap comprises reducing the performance state cap if the state of charge is below a first threshold and the temperature is below a second threshold. Additionally or alternatively to one or more of the examples disclosed above, in some examples, determining the health of the power source comprises determining an impedance of the power source. Additionally or alternatively to one or more of the examples disclosed above, in some examples, setting the performance state cap comprises reducing the performance state cap if the impedance of the power source is above a first threshold.

Some examples of the disclosure are directed to an electronic device, comprising: one or more processors; a power source; and memory storing one or more instructions, which when executed by the one or more processors, cause the electronic device to perform a method comprising: determining a health of the power source; determining a temperature of the power source; determining a state of charge of the power source; and setting a performance state cap for the electronic device based on at least the health of the power source. Additionally or alternatively to one or more of the examples disclosed above, in some examples, the performance state cap is a maximum power draw, from the power source, for the electronic device. Additionally or alternatively to one or more of the examples disclosed above, in some examples, setting the performance state cap comprises reducing the performance state cap if the temperature is below a first threshold. Additionally or alternatively to one or more of the examples disclosed above, in some examples, setting the performance state cap comprises increasing the performance state cap if the temperature is above a second threshold, different than the first threshold. Additionally or alternatively to one or more of the examples disclosed above, in some examples, setting the performance state cap comprises reducing the performance state cap if the state of charge is below a first threshold. Additionally or alternatively to one or more of the examples disclosed above, in some examples, setting the performance state cap comprises reducing the performance state cap if the state of charge is below a first threshold and the temperature is below a second threshold. Additionally or alternatively to one or more of the examples disclosed above, in some examples, determining the health of the power source comprises determining an impedance of the power source.

Although examples have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A method of an electronic device including a processor, a power source, and a respective component configured to draw power from the power source, the method comprising:
while the processor of the electronic device is executing operations in accordance with a first performance state:
determining a health of the power source by at least determining an amount of time the power source is above a threshold charge level;
determining a remaining charge of the power source; and
setting a performance state cap for the electronic device based on at least the health of the power source or the remaining charge of the power source, wherein setting the performance state cap causes the processor of the electronic device to begin executing operations, including operations associated with the respective component, in accordance with a second performance state, different from the first performance state.

2. The method of claim 1, wherein the performance state cap is a maximum power draw, from the power source, for the electronic device.

3. The method of claim 1, wherein setting the performance state cap comprises reducing the performance state cap if a temperature of the power source is below a first threshold.

4. The method of claim 3, wherein setting the performance state cap comprises maintaining the performance state cap if the temperature of the power source is above the first threshold.

5. The method of claim 3, wherein setting the performance state cap comprises increasing the performance state cap if the temperature of the power source is above a second threshold, different than the first threshold.

6. The method of claim 1, wherein setting the performance state cap comprises reducing the performance state cap if the remaining charge is below a first threshold.

7. The method of claim 1, wherein setting the performance state cap comprises reducing the performance state cap if the remaining charge is below a first threshold and a temperature of the power source is below a second threshold.

8. The method of claim 1, wherein determining the health of the power source comprises determining an impedance of the power source.

9. The method of claim 8, wherein setting the performance state cap comprises reducing the performance state cap if the impedance of the power source is above a first threshold.

10. The method of claim 1, further comprising determining a temperature of the power source, and wherein setting the performance state cap is based on at least the health of the power source, the remaining charge of the power source, or the temperature of the power source.

11. A non-transitory computer readable storage medium storing one or more programs, the one or more programs comprising instructions, which when executed by an electronic device including a processor, a power source, and a respective component configured to draw power from the power source, cause the electronic device to perform a method comprising:
while the processor of the electronic device is executing operations in accordance with a first performance state:
determining a health of the power source by at least determining an amount of time the power source is above a threshold charge level;
determining a remaining charge of the power source; and
setting a performance state cap for the electronic device based on at least the health of the power source or the remaining charge of the power source, wherein setting the performance state cap causes the processor of the electronic device to begin executing operations, including operations associated with the respective component, in accordance with a second performance state, different from the first performance state.

12. The non-transitory computer readable storage medium of claim 11, wherein the performance state cap is a maximum power draw, from the power source, for the electronic device.

13. The non-transitory computer readable storage medium of claim 11, wherein setting the performance state cap comprises reducing the performance state cap if a temperature of the power source is below a first threshold.

14. The non-transitory computer readable storage medium of claim 13, wherein setting the performance state cap comprises maintaining the performance state cap if the temperature of the power source is above the first threshold.

15. The non-transitory computer readable storage medium of claim 13, wherein setting the performance state cap comprises increasing the performance state cap if the temperature of the power source is above a second threshold, different than the first threshold.

16. The non-transitory computer readable storage medium of claim 11, wherein setting the performance state cap comprises reducing the performance state cap if the remaining charge is below a first threshold.

17. The non-transitory computer readable storage medium of claim 11, wherein setting the performance state cap comprises reducing the performance state cap if the remaining charge is below a first threshold and a temperature of the power source is below a second threshold.

18. The non-transitory computer readable storage medium of claim 11, wherein determining the health of the power source comprises determining an impedance of the power source.

19. The non-transitory computer readable storage medium of claim 18, wherein setting the performance state cap comprises reducing the performance state cap if the impedance of the power source is above a first threshold.

20. The non-transitory computer readable storage medium of claim 11, the method further comprising determining a temperature of the power source, and wherein setting the performance state cap is based on at least the health of the power source, the remaining charge of the power source, or the temperature of the power source.

21. The non-transitory computer readable storage medium of claim 11, wherein the operations comprise changing an amount of power consumed by the respective component.

22. The non-transitory computer readable storage medium of claim 11, wherein the amount of time is associated with a lifetime of the power source.

23. An electronic device, comprising:
one or more processors;

a power source;

a respective component configured to draw power from the power source; and memory storing one or more instructions, which when executed by the one or more processors, cause the electronic device to perform a method comprising:

while the one or more processors of the electronic device is executing operations in accordance with a first performance state:

determining a health of the power source by at least determining an amount of time the power source is above a threshold charge level;

determining a remaining charge of the power source; and setting a performance state cap for the electronic device based on at least the health of the power source or the remaining charge of the power source, wherein setting the performance state cap causes the one or more processors of the electronic device to begin executing operations, including operations associated with the respective component, in accordance with a second performance state, different from the first performance state.

24. The electronic device of claim 23, wherein the performance state cap is a maximum power draw, from the power source, for the electronic device.

25. The electronic device of claim 23, wherein setting the performance state cap comprises reducing the performance state cap if a temperature of the power source is below a first threshold.

26. The electronic device of claim 25, wherein setting the performance state cap comprises increasing the performance state cap if the temperature of the power source is above a second threshold, different than the first threshold.

27. The electronic device of claim 23, wherein setting the performance state cap comprises reducing the performance state cap if the remaining charge is below a first threshold.

28. The electronic device of claim 23, wherein setting the performance state cap comprises reducing the performance state cap if the remaining charge is below a first threshold and a temperature of the power source is below a second threshold.

29. The electronic device of claim 23, wherein determining the health of the power source comprises determining an impedance of the power source.

30. The electronic device of claim 23, the method further comprising determining a temperature of the power source, and wherein setting the performance state cap is based on at least the health of the power source, the remaining charge of the power source, or the temperature of the power source.

* * * * *